(12) United States Patent
Maguire

(10) Patent No.: US 11,076,214 B2
(45) Date of Patent: *Jul. 27, 2021

(54) WEARABLE AUDIO DEVICE

(71) Applicant: Bose Corporation, Framingham, MA (US)

(72) Inventor: Stephen J. Maguire, Grafton, MA (US)

(73) Assignee: Bose Corporation, Framingham, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/360,093

(22) Filed: Mar. 21, 2019

(65) Prior Publication Data

US 2020/0304895 A1    Sep. 24, 2020

(51) Int. Cl.
 *H04R 1/10* (2006.01)

(52) U.S. Cl.
 CPC ......... *H04R 1/1016* (2013.01); *H04R 1/1025* (2013.01)

(58) Field of Classification Search
 CPC ........ H04R 1/1016; H04R 1/1025; H02J 7/00
 See application file for complete search history.

(56) References Cited

U.S. PATENT DOCUMENTS

| 5,126,669 | A |   | 6/1992 | Hones et al. |
| 5,991,085 | A | * | 11/1999 | Rallison ............... G02B 27/017 345/8 |
| 9,141,194 | B1 |   | 9/2015 | Keyes et al. |
| 9,369,791 | B2 |   | 6/2016 | Tanaka |
| 9,854,345 | B2 |   | 12/2017 | Briggs |
| 9,883,280 | B2 |   | 1/2018 | Oosato et al. |
| 9,996,162 | B2 |   | 6/2018 | Kar et al. |
| 10,212,507 | B1 | * | 2/2019 | Maguire ............... H04R 1/1016 |
| 10,516,929 | B2 | * | 12/2019 | Maguire ............ G01R 33/0017 |
| 10,575,107 | B2 |   | 2/2020 | So et al. |
| 10,841,716 | B2 |   | 11/2020 | Perri et al. |
| 2005/0092919 | A1 | * | 5/2005 | Bellec ................... H01F 7/0278 250/290 |
| 2005/0111673 | A1 | * | 5/2005 | Rosen ..................... H04R 1/227 381/89 |

(Continued)

FOREIGN PATENT DOCUMENTS

| EP | 2645750 A1 | 10/2013 |
| WO | 2013155217 A1 | 10/2013 |

OTHER PUBLICATIONS

The International Search Report and the Written Opinion of the International Searching Authority dated Jul. 4, 2019 for PCT Application No. PCT/US2019/020914.

(Continued)

*Primary Examiner* — Fan S Tsang
*Assistant Examiner* — Angelica M McKinney
(74) *Attorney, Agent, or Firm* — Brian M. Dingman; Dingman IP Law, PC

(57) ABSTRACT

A wearable audio device with a magnetic field sensor that is constructed and arranged to sense the Earth's magnetic field. A magnet in the earphone, for example the magnet of the electro-acoustic transducer, produces a first magnetic field having a first magnetic field strength. A docking or parking magnet in the earphone produces a second magnetic field that is configured to reduce an influence of the first magnetic field on the magnetic field sensor.

21 Claims, 6 Drawing Sheets

(56) References Cited

U.S. PATENT DOCUMENTS

| | | | |
|---|---|---|---|
| 2006/0018075 A1* | 1/2006 | Schultz | G11B 5/0245 |
| | | | 361/143 |
| 2006/0034478 A1 | 2/2006 | Davenport | |
| 2007/0092093 A1 | 4/2007 | Shim | |
| 2009/0296947 A1 | 12/2009 | Duron et al. | |
| 2011/0044485 A1 | 2/2011 | Lin et al. | |
| 2011/0206225 A1 | 8/2011 | Moller et al. | |
| 2011/0273169 A1* | 11/2011 | LaCroix | G01D 5/145 |
| | | | 324/207.25 |
| 2011/0291497 A1* | 12/2011 | Choi | H02K 33/18 |
| | | | 310/25 |
| 2012/0219166 A1* | 8/2012 | Ball | H04R 25/606 |
| | | | 381/322 |
| 2013/0272563 A1 | 10/2013 | Boyd | |
| 2013/0329910 A1 | 12/2013 | Crosby et al. | |
| 2015/0003662 A1 | 1/2015 | Vernon et al. | |
| 2015/0181355 A1 | 6/2015 | Pedersen | |
| 2015/0195639 A1 | 7/2015 | Azmi et al. | |
| 2015/0281852 A1 | 10/2015 | Sacha et al. | |
| 2015/0326963 A1* | 11/2015 | Sorensen | H04R 1/1041 |
| | | | 381/74 |
| 2015/0365755 A1 | 12/2015 | Harper | |
| 2017/0014071 A1 | 1/2017 | Readdie et al. | |
| 2017/0090003 A1 | 3/2017 | Guo | |
| 2017/0093079 A1 | 3/2017 | Wagman et al. | |
| 2017/0160086 A1 | 6/2017 | Kesaniemi | |
| 2017/0208382 A1 | 7/2017 | Grinker | |
| 2017/0295443 A1 | 10/2017 | Boesen | |
| 2018/0070166 A1 | 3/2018 | Howell et al. | |
| 2018/0088185 A1 | 3/2018 | Woods et al. | |
| 2018/0096770 A1 | 4/2018 | Danielson et al. | |
| 2018/0115816 A1 | 4/2018 | Panecki et al. | |
| 2018/0115839 A1 | 4/2018 | Eichfeld et al. | |
| 2018/0193728 A1 | 7/2018 | Bashkirov et al. | |
| 2018/0211751 A1* | 7/2018 | Khoshkava | H01F 7/081 |
| 2019/0281376 A1* | 9/2019 | Maguire | H04R 1/1041 |
| 2019/0281377 A1* | 9/2019 | Maguire | G01C 17/38 |
| 2020/0280788 A1 | 9/2020 | Maguire | |
| 2020/0292633 A1 | 9/2020 | Maguire et al. | |
| 2020/0300932 A1 | 9/2020 | Maguire | |
| 2020/0304895 A1 | 9/2020 | Maguire | |

OTHER PUBLICATIONS

U.S. Appl. No. 62/626,967, filed Feb. 6, 2018; Applicant: Bose Corporation.

The International Search Report and the Written Opinion of the International Searching Authority dated Jun. 29, 2020 for PCT Application No. PCT/US2020/023485.

* cited by examiner

WEARABLE AUDIO DEVICE

BACKGROUND

This disclosure relates to a wearable audio device such as an earphone.

Wearable audio devices (e.g., earbuds or headphones) can include orientation tracking systems that use a magnetometer to track motions of the head and the direction in which the wearer is looking. Magnetometers need to accurately detect the Earth's magnetic field. The wearable audio device's electro-acoustic transducer typically includes a magnet. The wearable audio device can also include a magnet used to dock or park the wearable audio device to another structure. Since some wearable audio devices, such as in-ear headphones (sometimes also called earbuds) are desirably quite small, of necessity the magnetometer is close to other magnets. The magnetic field of the other magnets may have a magnetic field strength that is much greater than the Earth's magnetic field. Accordingly, the magnetic fields can overwhelm the magnetometer and prevent it from working properly.

SUMMARY

All examples and features mentioned below can be combined in any technically possible way.

In one aspect, a wearable audio device includes a magnetic field sensor that is constructed and arranged to sense the Earth's magnetic field, a first magnet that produces a first magnetic field having a first magnetic field strength, and a docking or parking magnet that produces a second magnetic field that is configured to reduce an influence of the first magnetic field on the magnetic field sensor.

Examples may include one of the above and/or below features, or any combination thereof. The magnetic field sensor may comprise a magnetometer, which may be a three-axis magnetometer. The docking or parking magnet may comprise a permanent magnet. The docking or parking magnet may comprise an array of a plurality of differently magnetized regions. This array may comprise a Halbach array.

Examples may include one of the above and/or below features, or any combination thereof. The first magnet may comprise a transducer magnet of an electro-acoustic transducer that is adapted to create an audio output. The wearable audio device may further include a housing that is constructed and arranged to direct the audio output towards the ear of the wearer. The docking or parking magnet may be positioned in the housing such that the second magnetic field reduces the strength of the transducer magnetic field at the magnetic field sensor. The electro-acoustic transducer may comprise a magnetic structure that comprises the transducer magnet and magnetic material that guides the transducer magnetic field.

Examples may include one of the above and/or below features, or any combination thereof. The wearable audio device may comprise an earbud with an earbud body, and the magnetic field sensor, the first magnet, and the docking or parking magnet may all be located in the earbud body. The magnetic field sensor may have a sensed magnetic field range where it operates linearly, and the second magnetic field may reduce the strength of the first magnetic field at the magnetic field sensor such that the sensed magnetic field strength is in the sensed magnetic field range where the magnetic field sensor operates linearly. The magnetic field sensor may be positioned less than 10 mm from the first magnet.

In another aspect, a wearable audio device includes an electro-acoustic transducer for creating audio output, the electro-acoustic transducer comprising a transducer magnet that produces a transducer magnetic field having a magnetic field strength. The wearable audio device also includes a magnetometer constructed and arranged to sense the Earth's magnetic field, and a docking or parking magnet constructed and arranged to produce a nulling magnetic field that reduces the strength of the transducer magnetic field at the magnetometer.

Examples may include one of the above and/or below features, or any combination thereof. The magnetometer may have a sensed magnetic field range where it operates linearly, and the nulling magnetic field may reduce the strength of the transducer magnetic field at the magnetometer such that the sensed magnetic field strength is in the sensed magnetic field range where the magnetometer operates linearly. The transducer magnet may have a diameter of about 8 mm and the magnetometer may be positioned less than 10 mm from the electro-acoustic transducer. The magnetometer may comprise a three-axis magnetometer. The docking or parking magnet may comprise a permanent magnet. The docking or parking magnet may comprise an array of a plurality of differently magnetized regions, which may comprise a Halbach array. The wearable audio device may further comprise a housing, and the electro-acoustic transducer, the magnetometer, and the docking or parking magnet may all be located in the housing.

DETAILED DESCRIPTION

Figure 1:
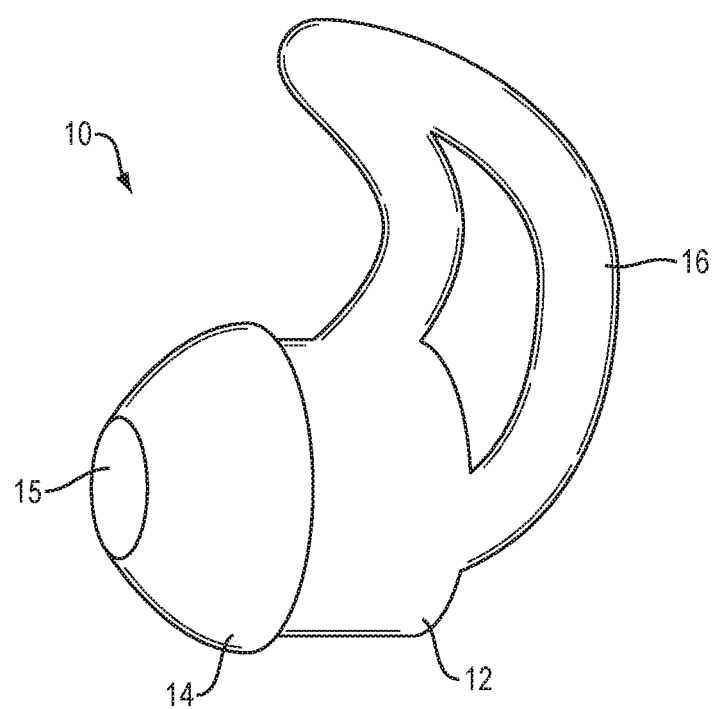
FIG. 1 is perspective view of an earphone.

Many wearable audio devices are powered by batteries that must be periodically charged. Battery charging can be accomplished by direct electrical connection or by inductance, using a charger that may be built into a case that is also configured to store the wearable audio devices when they aren't in use. The charger can alternatively be carried by another structure such as a separate battery charging device. In order for the wearable audio device batteries to properly charge, the wearable audio device must be brought into close proximity to the battery charger, which requires the wearable audio device to be "docked" in the battery charger. Docking of wearable audio devices in a charger is often accomplished using magnetic attraction of the wearable audio device to the correct location of the charger. A docking magnet, located in the wearable audio device such that it is attracted to a magnet or magnetic material in the charger, can be used to help properly locate and orient the wearable audio device in the charger.

Wearable audio devices, in particular earbuds, may be configured to allow the left and right earbuds to be held or "parked" together when not in use. Earbuds can also be configured to be parked to another structure, such as a neckband. Parking of earbuds is often accomplished with a parking or coupling magnet in the earbud, where the parking or coupling magnet is located such that it is at or very close to the surface of the earbud.

Wearable audio devices (one non-limiting example being earphones) can include one or both of a docking magnet and a parking magnet. Wearable audio devices many times include other magnetic devices, for example a magnetometer, the transducer magnet of an electro-acoustic transducer, ferrite cores (which may be used in filters, for example), and magnetic reed switches, to name only several of many possible magnetic devices in a wearable audio device such as an earbud. These magnetic devices are typically designed to operate without substantial interference from stray magnetic fields. Magnetic devices typically operate in a stable operational range only if the strength of any stray magnetic field is relatively low. The docking or parking magnet in a wearable audio device can be configured to reduce adverse effects of stray magnetic fields on magnetic device(s) of the wearable audio device.

In an earphone with an electro-acoustic transducer magnet and a magnetometer that is located close to the transducer, the transducer's magnetic field can overwhelm the magnetometer and prevent it from properly detecting the strength of the Earth's magnetic field. The magnetometer can be brought into a region of stable operation by placing the earphone docking or parking magnet such that its magnetic field partially or fully nulls the transducer magnetic field at the location of the magnetometer, sufficiently such that the magnetometer can operate in its operational region where stray magnetic fields do not overwhelm the Earth's magnetic field.

FIG. 1 is a perspective view of a wireless in-ear headphone, earphone, or earbud, 10. An earphone is only one non-limiting example of the subject audio device. Other examples are described elsewhere herein. Earbud 10 includes body or housing 12 that houses the active components of the earbud. Portion 14 is coupled to body 12 and is pliable so that it can be inserted into the entrance of the ear canal. Sound is delivered through opening 15. Retaining loop 16 is constructed and arranged to be positioned in the outer ear, for example in the antihelix, to help retain the earbud in the ear. Earbuds are well known in the field (e.g., as disclosed in U.S. Pat. No. 9,854,345, the disclosure of which is incorporated herein by reference), and so certain details of the earbud are not further described herein. An earbud 10 is an example of a wearable audio device according to this disclosure, but is not limiting of the scope of the disclosure, as stray magnetic fields from magnetic devices in other types of wearable audio devices can also be reduced by the magnetic field from a device docking or parking magnet.

Figure 2:
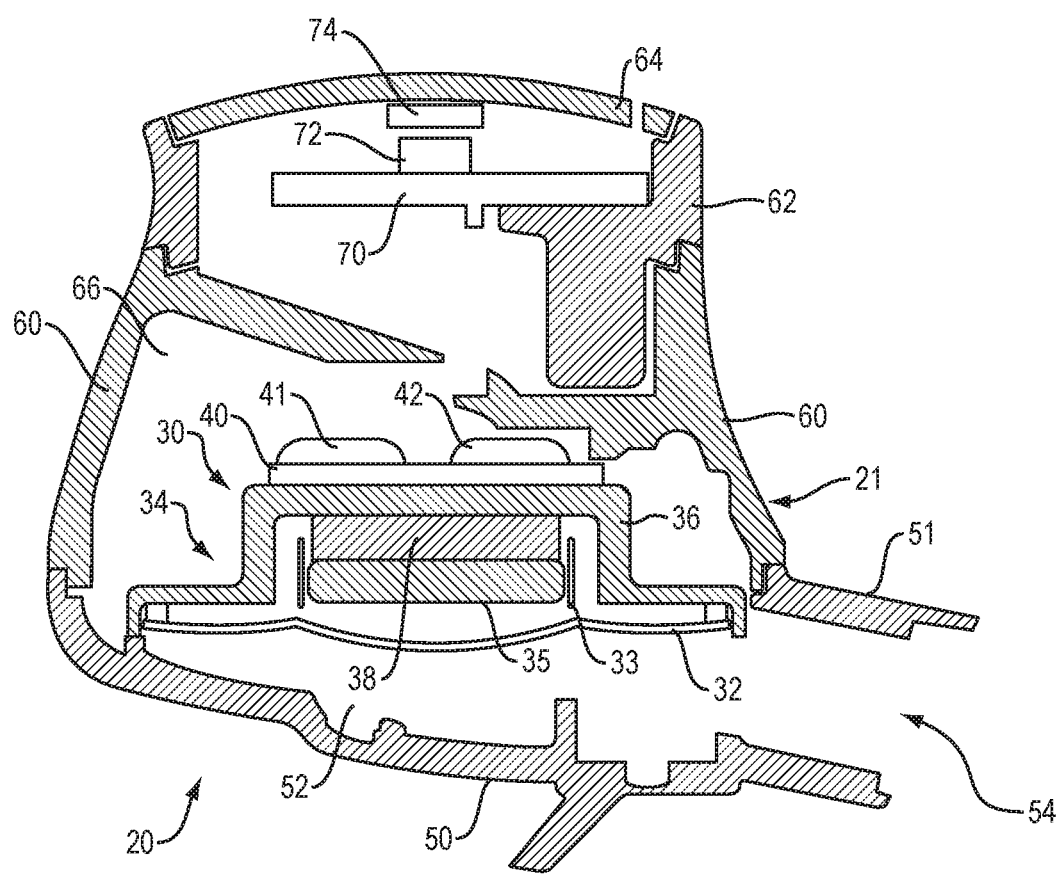
FIG. 2 is a partial cross-sectional view of elements of an earphone.

FIG. 2 is a partial cross-sectional view of only certain elements of an earphone 20 that are useful to a better understanding of the present disclosure. Earphone 20 comprises housing 21 that encloses electro-acoustic transducer 30. Housing 21 comprises front housing portion 50 and rear housing portions 60 and 62. Transducer 30 has diaphragm 32 that is driven in order to create sound pressure in front cavity 52. Sound pressure is directed out of front housing portion 50 via opening 54. When earphone 20 is an earbud, as shown by earbud 10 in FIG. 1, there is typically a pliable tip (not shown) that is engaged with neck 51 of housing portion 50, to help direct the sound into the ear canal. Earphone housing 21 further comprises a rear enclosure made from rear housing portions 60 and 62, and grille 64. Note that the details of earphone 20 are exemplary of aspects of earphones and are not limiting of the scope of this disclosure, as the present magnetic field reduction or nulling at the location of the magnetometer can be used in varied types and designs of earphones and other wearable audio devices.

Transducer 30 further comprises magnetic structure 34. Magnetic structure 34 comprises transducer magnet 38 and magnetic material that functions to confine and guide the magnetic field from magnet 38, so that the field properly interacts with coil 33 to drive diaphragm 32, as is well known in the electro-acoustic transducer field. The magnetic material comprises cup 36 and front plate 35, both of which are preferably made from a material with relatively high magnetic susceptibility, also as is known in the field. Transducer printed circuit board (PCB) 40 carries electrical and electronic components (not shown) that are involved in driving the transducer. Pads 41 and 42 are locations where wires (not shown) can be coupled to PCB 40.

Three-axis magnetometer 72 is mounted on PCB 70 and is arranged to sense the strength of magnetic fields in three axes at the location of the magnetometer, as is known in the field. Magnetometer 72 is configured to detect the Earth's magnetic field. The output of magnetometer 72 can be used to determine the direction in which the wearer's head is pointed, as described in U.S. patent application Ser. No. 62/626,967, filed on Feb. 6, 2018, the entire disclosure of which is incorporated herein by reference. As discussed above, earphone 20 may additionally or alternatively include other magnetic devices that might be adversely impacted by stray magnetic fields from the transducer magnet or other magnetic devices.

Since magnetometer 72 is relatively close to transducer magnet 38, the transducer's magnetic field can overwhelm the magnetometer and prevent it from properly detecting the strength of the Earth's magnetic field. The magnetometer can be brought into its specified measurement range (where stray magnetic fields do not skew the desired measurement) with an additional nulling magnet. Parking magnet 74 is in this non-limiting example located just inside of grill 64. It should be understood that a parking magnet is generally located inside of or at least close to (adjacent) the inside surface of earphone housing 21 at a location where it can act to help park the earphone to another structure, such as another earphone housing. Magnet 74 could alternatively be a coupling or docking magnet, which would generally be located inside of or at the inside surface of housing 21 at a location where it can act to help dock or couple the earphone to a battery charger. One possible location of a coupling magnet would be somewhere on the interior of front housing portion 50 inside the front cavity 52.

Magnet 74 is also located such that its magnetic field partially or fully nulls the transducer magnetic field at the location of magnetometer 72. This transducer magnetic field nulling should take place in any one, two, or three of the three axes in which stable operation of the magnetometer is needed. In the present case, stable magnetometer results are desired in all three axes, so magnet 74 is desirably configured to sufficiently null the Earth's magnetic field in all three axes. It should be understood that the location of nulling magnet 74 in FIG. 2 is representative, and magnet 74 may actually be located elsewhere in housing 21. It should also be understood that magnet 74 could be a permanent magnet or an electromagnet, it being necessary only to properly place and orient a nulling magnetic field, as described elsewhere herein. The nulling should be sufficient such that magnetometer 72 can operate in at least one sense axis in its operational region where stray magnetic fields do not overwhelm the Earth's magnetic field. Linear operation of magnetometers (where there are stray magnetic fields that are not so strong that they overwhelm sensing or detection of the desired field) is known in the technical field, and so is not further described herein.

The docking or parking magnet (e.g., magnet 74), may comprise a single permanent magnet or an array or assembly of two or more permanent magnets. In either case, the docking or parking magnet generates a magnetic field that, at the location of the magnetometer, can reduce the strength of the stray magnetic field from the transducer magnet(s) in one, two, or three axes. In one non-limiting example the docking or parking magnet comprises a Halbach array. A Halbach array is a configuration of three or more permanent magnets which are differently magnetized from one another, or three or more differently magnetized portions or regions of a monolithic structure. The differently magnetized regions of the Halbach array are arranged such that on one side of the Halbach array the magnetic fields from the different regions reinforce, and on another side of the Halbach array the fields from the different regions cancel. One arrangement, which may be termed a discrete Halbach array, comprises three permanent magnets (which may be considered to be portions or regions of the overall array) arranged side-by-side into a generally planar Halbach array. Another arrangement, which may be termed a continuous Halbach array, comprises three side-by-side portions or regions of a monolithic structure, where the regions are magnetized differently from one another. Note that either or both of the docking and parking or clasping magnet can be a Halbach array.

An advantage of a Halbach array is that its field is strong on one side and weak on the other side. If the side on which the field is strong is placed close to the inside surface of the wearable audio device housing, the field is better able to couple or park to another structure. At the same time, the field on the opposite side facing into the wearable audio device housing is weak and so it has less effect on the magnetometer and/or other magnetic devices as compared to a single magnet used that has equal field strength on both sides as a parking or docking magnet. The effect of the Halbach array at the magnetometer and/or other magnetic device may be small enough that a separate nulling magnet device may not be needed. In other words, the combined magnetic fields at the magnetometer and/or other magnetic device from the Halbach array and the transducer magnet(s) may be small enough that the magnetometer and/or other magnetic device can operate in its linear range without the need for an additional nulling magnetic field. Another advantage of a Halbach array is that it can achieve the same parking or docking field as a single magnet in less volume and less thickness than a single magnet. This frees up space in the earphone for other components or other functionalities. Another advantage is that the magnetic field on one side of the parking/docking magnet is stronger than the magnetic field of a comparably-sized single magnet.

Figure 3:
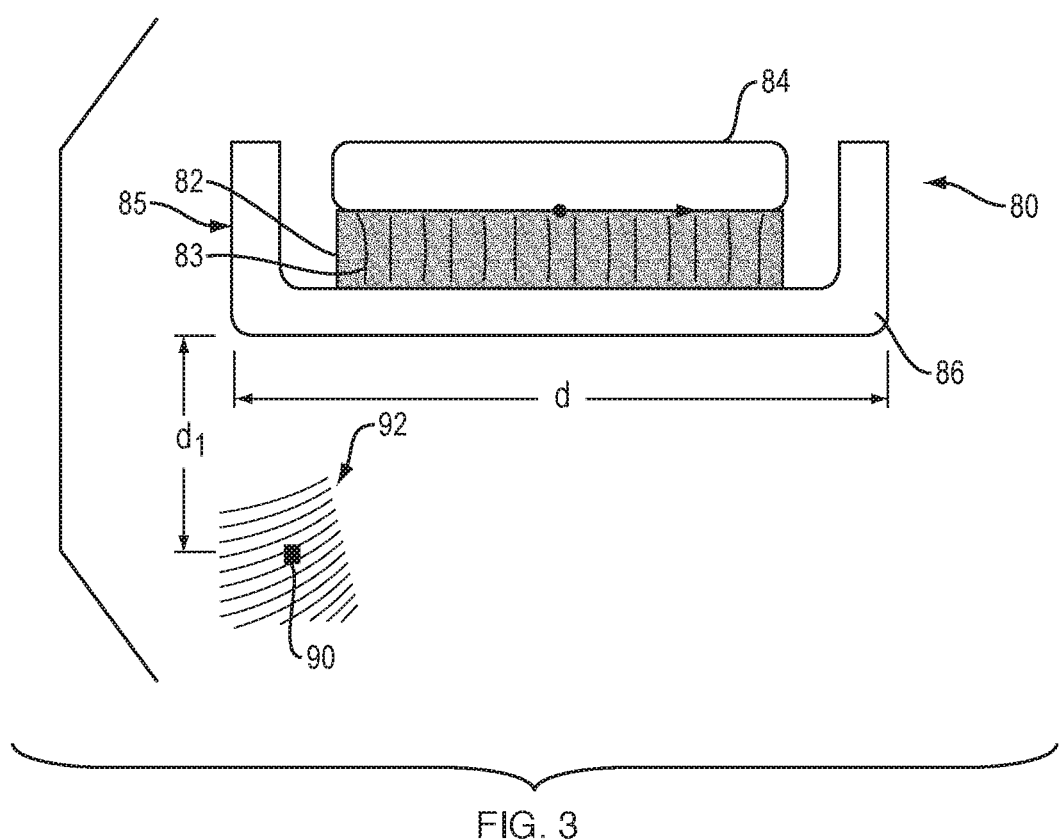
FIG. 3 is a schematic view of the magnetic structure of an earphone and its magnetic field at the location of a magnetic field sensor.
Figure 4:
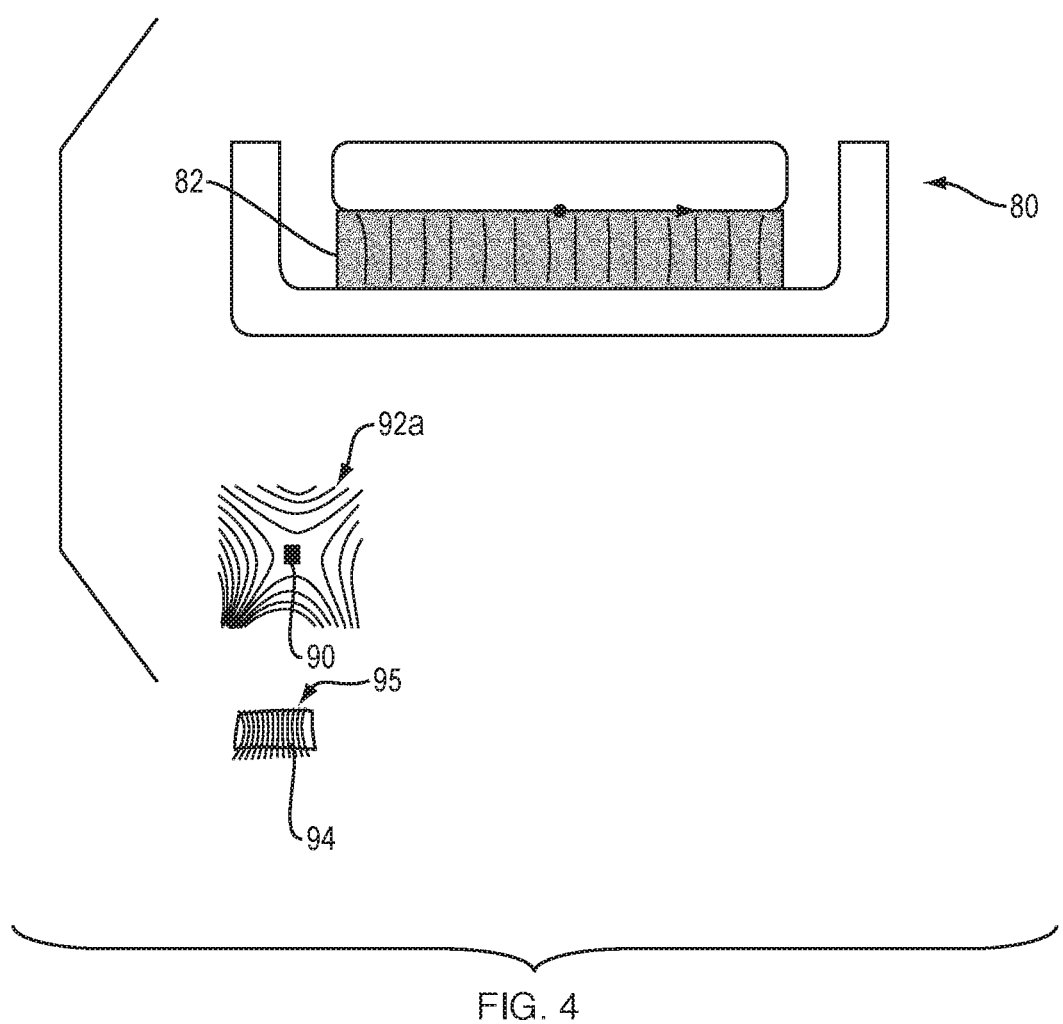
FIG. 4 is a view similar to that of FIG. 3 but including a nulling magnet.

FIGS. 3 and 4 illustrate aspects of an earphone. Earphone electro-acoustic transducer 80 comprises magnet 82, and a magnetic structure 85 that comprises cup 86 and front member 84. Magnet 82 has a magnetic field, which is represented by the generally vertical field line representations 83. Magnetic fields and field line representations are well known in the art and so are not further described herein. The magnetic structure 85 spans a distance "d." Magnetometer 90 is spaced a distance "$d_1$" from magnetic structure 85.

The field from magnet 83 in the vicinity of magnetometer 90 is represented by field lines 92. In one non-limiting example, the field strength of the magnetic field from magnet 82 in the vicinity of magnetometer 90 is about 500 µT. In contrast, the strength of the Earth's magnetic field is generally approximately 50 µT, or about $\frac{1}{10}^{th}$ of the field from magnet 82. With a stray field such as this that overwhelms the field to be sensed, magnetometer 90 can be inaccurate. Accordingly, the look direction sensing involving magnetometer 90 can be inaccurate. The strength of the stray magnetic field(s) that bring a sensor out of range are dependent on the particular sensor. It should be understood that electro-acoustic magnet transducers can have varied shapes, sizes, locations, and field strengths, and that the illustrative values set forth in the examples are not limiting of the scope of this disclosure.

FIG. 4 illustrates schematically an effect of nulling parking or docking magnet 94. Nulling magnet 94 has a magnetic field, which is represented by the generally vertical field line representations 95. Nulling magnet 94 has a size, shape, magnetic orientation, magnetic field strength, and location relative to transducer 80 and magnetometer 90 such that its magnetic field is superimposed on the field from the transducer magnet 82 sufficiently to fully or partially null the transducer field in three axes, at the location of magnetometer 90. In this non-limiting example, field nulling is indicated by field line representation 92a, showing a field null at magnetometer 90 (i.e., no field lines intersect magnetometer 90). It should be understood that the field does not need to be fully nulled by nulling magnet 94. Rather, as described above, the strength of the field needs to be reduced sufficiently such that the magnetometer can sense the Earth's magnetic field. The reduction in the transducer field at the magnetometer that needs to be accomplished with the nulling magnet will in part depend on the particular magnetometer used, as would be apparent to one skilled in the field. Also, it should be understood that magnetic fields are three-dimensional, while FIGS. 3 and 4 are two-dimensional. Those skilled in the field will understand the extent to which the transducer magnet's field in three dimensions needs to be nulled in order for the sensing of the Earth's magnetic field to be accomplished with sufficient accuracy for the particular application of the Earth's magnetic field sensor, and can make an appropriate selection of the nulling magnet parameters described above to accomplish such results.

In one non-limiting example, transducer magnet 82 can be a generally cylindrical magnet with a diameter of about 8 mm, and cup 86 can have a diameter d of about 10 mm. In one non-limiting example, sensor 90 can be positioned less than about 10 mm (distance $d_1$) from transducer 80.

Figure 5:
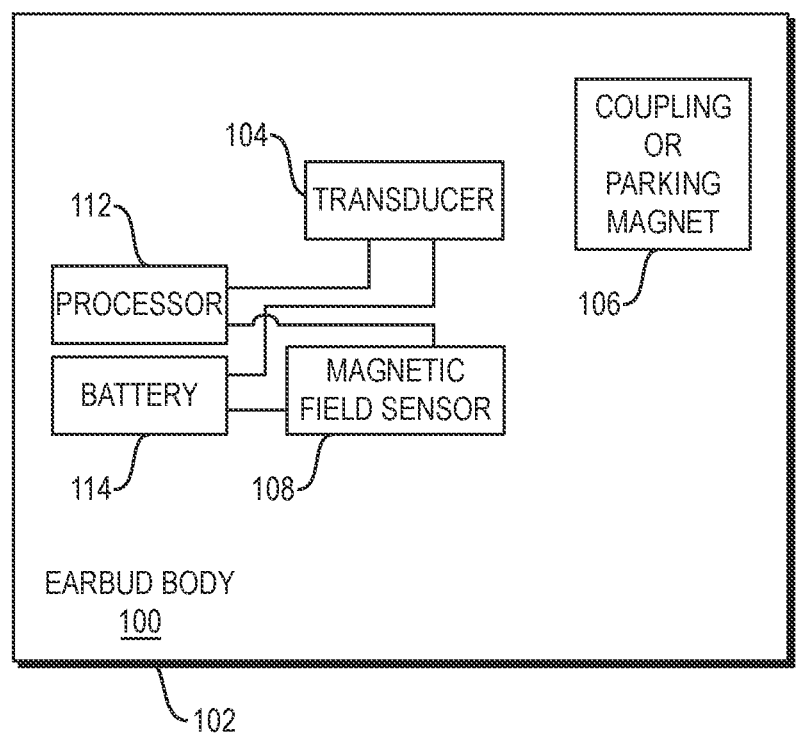
FIG. 5 is a schematic diagram of an earphone.

FIG. 5 is a schematic diagram of in-ear headphone 102, illustrating in part a coupling or parking magnet 106. The described components are located in earbud body 100. Battery 114 provides power to powered components. Processor 112 is used, in part, to drive transducer 104. Processor 112 is also used to determine the wearer's look direction, in part using the output of magnetic field sensor 108. It should be understood that earphones will have more components and can have different components than those shown in FIG. 5. Some earphones include a magnet other than the transducer magnet. This other magnet is represented in this non-limiting example by coupling or parking magnet 106. Coupling or parking magnet 106 can be used to couple or park earphone 100 to another structure. As one non-limiting example, magnet 106 can be used to "dock" an earbud to a battery charger. As another non-limiting example, magnet 106 can be used to park an earbud to another structure, such as a neckband or another earbud. Other uses of coupling and/or parking magnets are known in the field and are included within the scope of the present disclosure.

All of the magnets in earbud body 100 of earphone 102 create magnetic fields that can adversely impact the accuracy of the sensing of the Earth's magnetic field by sensor 108, as described above. By proper sizing, orientation and placement of magnet 106, the magnetic field from transducer 104 at sensor 108 can be reduced such that sensor 108 can detect the Earth's magnetic field, as described above.

One or more of the above described systems and methods, in various examples and combinations, may be used in a wide variety of audio systems, including wearable audio devices in various form factors. Unless specified otherwise, the term wearable audio device, as used in this document, includes headphones and various other types of personal audio devices such as head, shoulder or body-worn acoustic devices (e.g., audio eyeglasses or other head-mounted audio devices) that include one more acoustic transducers to receive and/or produce sound, with or without contacting the ears of a user. It should be noted that although specific implementations of speaker systems primarily serving the purpose of acoustically outputting audio are presented with some degree of detail, such presentations of specific implementations are intended to facilitate understanding through provisions of examples and should not be taken as limiting either the scope of disclosure or the scope of claim coverage.

Elements of FIG. 5 are shown and described as discrete elements in a block diagram. These may be implemented as one or more of analog circuitry or digital circuitry. Alternatively, or additionally, they may be implemented with one or more microprocessors executing software instructions. The software instructions can include digital signal processing instructions. Operations may be performed by analog circuitry or by a microprocessor executing software that performs the equivalent of the analog operation. Signal lines may be implemented as discrete analog or digital signal lines, as a discrete digital signal line with appropriate signal processing that is able to process separate signals, and/or as elements of a wireless communication system.

When processes are represented or implied in the block diagram, the steps may be performed by one element or a plurality of elements. The steps may be performed together or at different times. The elements that perform the activities may be physically the same or proximate one another, or may be physically separate. One element may perform the actions of more than one block. Audio signals may be encoded or not, and may be transmitted in either digital or analog form. Conventional audio signal processing equipment and operations are in some cases omitted from the drawing.

The example of FIG. 5 comprises a processor that is configured to use computer-implemented steps that will be apparent to those skilled in the art. For example, it should be understood by one of skill in the art that the computer-implemented steps may be stored as computer-executable instructions on a computer-readable medium such as, for example, floppy disks, hard disks, optical disks, Flash ROMs, nonvolatile ROM, and RAM. Furthermore, it should be understood by one of skill in the art that the computer-executable instructions may be executed on a variety of processors such as, for example, microprocessors, digital signal processors, gate arrays, etc. For ease of exposition, not every step or element of the systems and methods described above is described herein as part of a computer system, but those skilled in the art will recognize that each step or element may have a corresponding computer system or software component. Such computer system and/or software components are therefore enabled by describing their corresponding steps or elements (that is, their functionality), and are within the scope of the disclosure.

Figure 6:
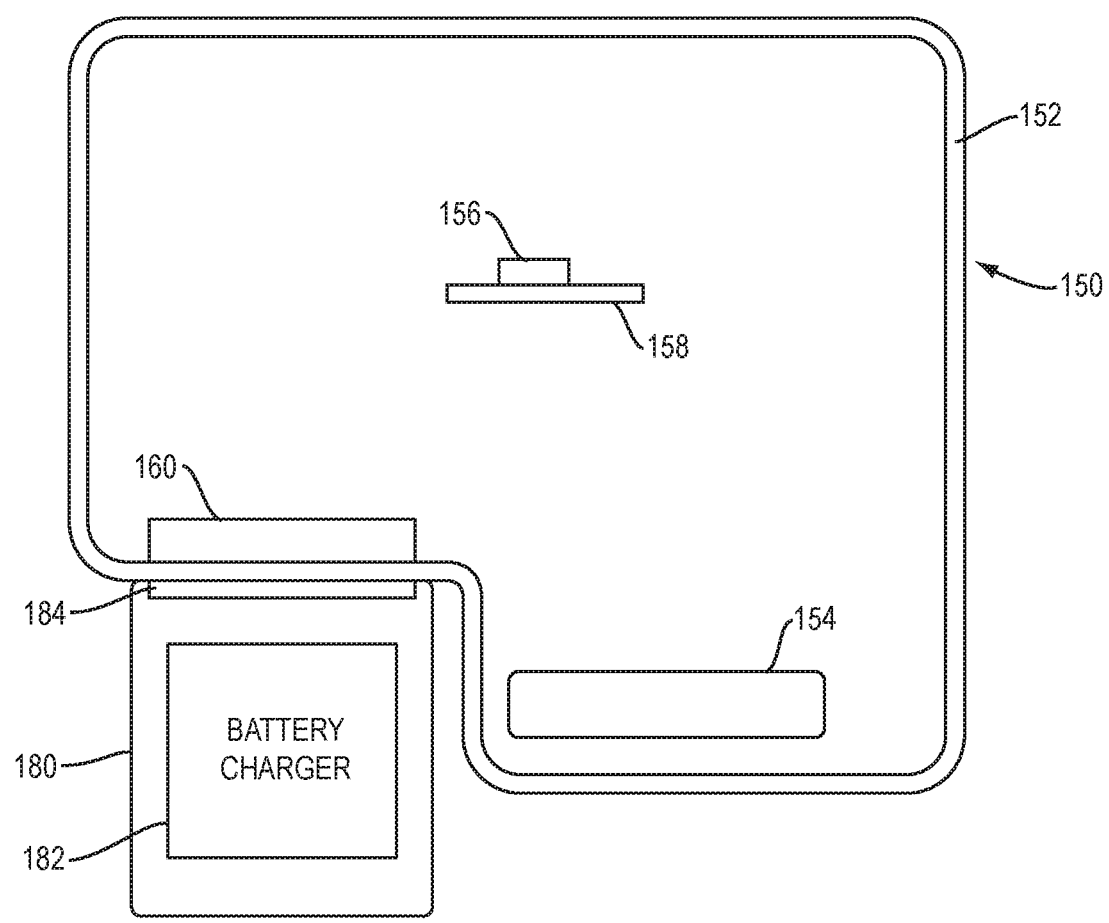
FIG. 6 is a partial, schematic, cross-sectional diagram of an earbud docked to a battery charging device.

FIG. 6 is a partial, schematic, cross-sectional diagram of an earbud 150 docked to a battery charging device 180. Most of the components of earbud 150 are not included, simply for ease of illustration. Earbud 150 includes earbud body 152. Inside of body 152 are transducer magnet 154 and three-axis magnetometer 156 that is located on printed circuit board (PCB) 158. Docking magnet 160 is typically located just inside of earbud body 152 or it can even be located such that it is exposed to the outside of body 152. Magnet 160 is used to hold earbud 150 against and in the correct orientation relative to charging device 180 such that the earbud batteries (not shown) can be recharged by charging device 180 via its battery charger 182. Charging device 180 could, for example, work by direct electrical connection to the earbud batteries, or by induction, as is known in the field. Magnet or magnetic metal plate 184 of battery charging device 180 can help to dock the earbud to the charger. Magnet 160 is located, sized and oriented such that it partially or fully nulls the magnetic field from magnet 154 at sensor 156. Magnet 160 thus has dual functions (docking and nulling) in the earbud.

In some cases, magnet 160 is combined with an additional nulling magnet that together null stray magnetic fields within a wearable audio device.

A number of implementations have been described. Nevertheless, it will be understood that additional modifications may be made without departing from the scope of the inventive concepts described herein, and, accordingly, other examples are within the scope of the following claims.

What is claimed is:

1. A wearable audio device, comprising:
   an electro-acoustic transducer that is adapted to create an audio output;
   a housing that is constructed and arranged to direct the audio output towards the ear of the wearer, wherein the housing defines an interior surface;
   a magnetic field sensor that is constructed and arranged to sense the Earth's magnetic field;
   a first magnet that produces a first magnetic field having a first magnetic field strength; and
   a docking or parking magnet that produces a second magnetic field that is configured to reduce an influence of the first magnetic field on the magnetic field sensor, wherein the docking or parking magnet is at or very close to the interior surface of the housing.

2. The wearable audio device of claim 1, wherein the magnetic field sensor comprises a magnetometer.

3. The wearable audio device of claim 1, wherein the magnetic field sensor comprises a three-axis magnetometer.

4. The wearable audio device of claim 1, wherein the docking or parking magnet comprises a permanent magnet.

5. The wearable audio device of claim 1, wherein the first magnet comprises a transducer magnet of the electro-acoustic transducer.

6. The wearable audio device of claim 5, wherein the docking or parking magnet is positioned in the housing such that the second magnetic field reduces the strength of the transducer magnetic field at the magnetic field sensor.

7. The wearable audio device of claim 5, wherein the electro-acoustic transducer comprises a magnetic structure that comprises the transducer magnet and magnetic material that guides the transducer magnetic field.

8. The wearable audio device of claim 1, comprising an earbud with an earbud body that comprises the housing, and wherein the magnetic field sensor, the first magnet, and the docking or parking magnet are all located in the earbud body.

9. The wearable audio device of claim 1, wherein the magnetic field sensor has a sensed magnetic field range where it operates linearly, and wherein the second magnetic field reduces the strength of the first magnetic field at the magnetic field sensor such that the sensed magnetic field strength is in the sensed magnetic field range where the magnetic field sensor operates linearly.

10. The wearable audio device of claim 1, wherein the magnetic field sensor is positioned less than 10 mm from the first magnet.

11. The wearable audio device of claim 1, wherein the docking or parking magnet comprises an array of a plurality of differently magnetized regions.

12. The wearable audio device of claim 11, wherein the array of a plurality of differently magnetized regions comprises a Halbach array.

13. A wearable audio device, comprising:
an electro-acoustic transducer for creating audio output, the electro-acoustic transducer comprising a transducer magnet that produces a transducer magnetic field having a magnetic field strength;
a magnetometer constructed and arranged to sense the Earth's magnetic field; and
a docking or parking magnet constructed and arranged to produce a nulling magnetic field that reduces the strength of the transducer magnetic field at the magnetometer;
wherein the magnetometer has a sensed magnetic field range where it operates linearly, and wherein the nulling magnetic field reduces the strength of the transducer magnetic field at the magnetometer such that the sensed magnetic field strength is in the sensed magnetic field range where the magnetometer operates linearly.

14. The wearable audio device of claim 13, wherein the transducer magnet has a diameter of about 8 mm and the magnetometer is positioned less than 10 mm from the electro-acoustic transducer.

15. The wearable audio device of claim 13, wherein the magnetometer comprises a three-axis magnetometer.

16. The wearable audio device of claim 13, wherein the docking or parking magnet comprises a permanent magnet.

17. The wearable audio device of claim 13, further comprising a housing that defines an interior surface, and wherein the electro-acoustic transducer, the magnetometer, and the docking or parking magnet are all located in the housing.

18. The wearable audio device of claim 17, wherein the docking or parking magnet is at or very close to the interior surface of the housing.

19. The wearable audio device of claim 13, wherein the docking or parking magnet comprises an array of a plurality of differently magnetized regions.

20. The wearable audio device of claim 19, wherein the array of a plurality of differently magnetized regions comprises a Halbach array.

21. A wearable audio device, comprising:
a magnetic field sensor that is constructed and arranged to sense the Earth's magnetic field;
a first magnet that produces a first magnetic field having a first magnetic field strength; and
a docking or parking magnet that produces a second magnetic field that is configured to reduce an influence of the first magnetic field on the magnetic field sensor;
wherein the magnetic field sensor has a sensed magnetic field range where it operates linearly, and wherein the second magnetic field reduces the strength of the first magnetic field at the magnetic field sensor such that the sensed magnetic field strength is in the sensed magnetic field range where the magnetic field sensor operates linearly.

* * * * *